United States Patent
Min

(10) Patent No.: US 10,184,982 B2
(45) Date of Patent: Jan. 22, 2019

(54) CIRCUIT AND METHOD FOR DIFFERENTIAL SIGNAL SKEW DETECTION

(71) Applicant: Realtek Semiconductor Corporation, Hsinchu (TW)

(72) Inventor: Shawn Min, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/700,954

(22) Filed: Sep. 11, 2017

(65) Prior Publication Data

US 2018/0074125 A1 Mar. 15, 2018

(30) Foreign Application Priority Data

Sep. 13, 2016 (TW) .............................. 105129683 A

(51) Int. Cl.
  *H03K 5/153* (2006.01)
  *G01R 31/317* (2006.01)
  *G01R 19/10* (2006.01)
  *G01R 31/3193* (2006.01)

(52) U.S. Cl.
  CPC ....... *G01R 31/31725* (2013.01); *G01R 19/10* (2013.01); *G01R 31/31937* (2013.01)

(58) Field of Classification Search
  CPC .......................... G01R 31/31725; G01R 19/10
  See application file for complete search history.

(56) References Cited

U.S. PATENT DOCUMENTS

| | | | |
|---|---|---|---|
| 6,198,307 B1 * | 3/2001 | Garlepp ............. | H03K 19/0005 326/27 |
| 8,305,113 B1 * | 11/2012 | Payne .................... | H03K 5/003 327/72 |
| 8,429,439 B2 * | 4/2013 | Asmanis ........... | H04L 25/03878 327/161 |
| 9,065,436 B2 * | 6/2015 | Kim ........................ | H03K 5/12 |
| 2003/0043065 A1 | 3/2003 | Lin et al. | |

* cited by examiner

*Primary Examiner* — Kenneth B Wells
(74) *Attorney, Agent, or Firm* — WPAT, PC

(57) ABSTRACT

The present invention discloses a differential signal skew detecting circuit configured to detect a skew of a differential signal. An embodiment of the circuit includes: a common mode voltage outputting circuit configured to output a common mode reference voltage and a common mode skew voltage; and a skew detecting circuit configured to inspect the common mode reference voltage and the common mode skew voltage according to a clock signal so as to output a skew detection value, in which when the skew detecting circuit detects the skew of the differential signal, the skew detection value is a first value, and when the skew detecting circuit detects no skew of the differential signal, the skew detection value is a second value.

18 Claims, 11 Drawing Sheets

CIRCUIT AND METHOD FOR DIFFERENTIAL SIGNAL SKEW DETECTION

BACKGROUND OF THE INVENTION

1. Field of the Invention

The present invention relates to the detection of a differential signal, especially to the skew detection of a differential signal.

2. Description of Related Art

Since the transmission paths of the positive-end and negative-end signals of a differential signal are unlikely to be identical, the positive-end and negative-end signals are unlikely to reach a receiver at the same time. As a result, the receiver may incorrectly analyze the differential signal and generate incorrect data. The above-mentioned problem is called the intra-pair skew of a differential signal as shown in FIG. 1. The solid line and dotted line in FIG. 1 stand for the positive-end and negative-end signals of a differential signal respectively, while the waveform and periodicity of a real differential signal instead of those as shown in FIG. 1 are usually more complicated. Generally, as the transmission speed goes up, the influence of the intra-pair skew becomes more severe.

SUMMARY OF THE INVENTION

An object of the present invention is to provide a differential signal skew detecting circuit and method capable of making improvements over the prior arts.

The present invention discloses a differential signal skew detecting circuit configured to detect a skew of a differential signal. An embodiment of the circuit includes: a common mode voltage outputting circuit configured to output a common mode reference voltage and a common mode skew voltage; and a skew detecting circuit configured to inspect the common mode reference voltage and the common mode skew voltage according to a clock signal, and thereby output a skew detection value, wherein when the skew detecting circuit detects the skew of the differential signal, the skew detection value is a first value; and when the skew detecting circuit does not detect the skew of the differential signal, the skew detection value is a second value. In an alternative embodiment, the differential signal skew detecting circuit further includes: a sequence recording circuit configured to record a sequence which correlates with the differential signal and includes a plurality of sequence values; and a determining circuit configured to determine which of a first-end signal and a second-end signal of the differential signal is leading according to the sequence and the skew detection value.

The present invention further discloses a differential signal skew detecting method operable to detect a skew of a differential signal. An embodiment of the method includes the following steps: outputting a common mode reference voltage and a common mode skew voltage; and comparing the common mode reference voltage with the common mode skew voltage, and thereby outputting a skew detection value, wherein when the skew detection value conforms to a first value, the skew of the differential signal reaches a predetermined condition; and when the skew detection value conforms to a second value, the skew of the differential signal does not reach the predetermined condition. In an alternative embodiment, the differential signal skew detecting method further includes: recording a sequence which is obtained by sampling the differential signal according to a clock signal and includes a plurality of sequence values; and determining which of a first-end signal and a second-end signal of the differential signal being leading according to the sequence and the skew detection value.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in this specification, such term should be explained accordingly.

The present invention discloses a differential signal skew detecting circuit and method configured to detect a skew of a differential signal. This invention finds applications, for example, in an integrated circuit (e.g., an image processing integrated circuit), a system device (e.g., a desktop or handheld image processing device), and the processing of High Definition Multimedia Interface (HDMI) signal. On account of that some common components of the circuit of the present invention could be readily known to those skilled in the art, the details of such components are omitted for brevity. Besides, the method of the present invention can be in the form of firmware and/or software which could be executed by the circuit of the present invention or the equivalent thereof. It should be noted that if an implementation derived from one or more of the embodiments in the following description is practicable, a person of ordinary skill in the art can selectively make use of some or all features in one embodiment or selectively make use of a combination of some or all features in several embodiments to realize the implementation.

In order to solve the intra-pair skew problem of a differential signal, Applicant provides a solution using an equalizer of a receiver to adjust the gain of the different signal, so as to reduce the influence of the intra-pair skew. However, if the differential signal is attenuated due to transmission distance, unmatched lines, signal skew, etc., the equalizer will be incapable of reducing the influence of the intra-pair skew effectively. Applicant provides another solution using the information of data error rate, the selection of equalizer parameter, the information of transmission line length, etc. to find out whether an abnormal state exists and then determine whether the intra-pair skew of a differential signal exists accordingly, so as to have a receiver stop using the positive-end or negative-end signal of the differential signal when detecting the intra-pair skew and instead use the other signal (which is taken as a single-ended signal now) for data recovery. However, this solution is unable to confirm that the abnormal state is caused by the intra-pair skew, and unable to determine with certainty which of the positive-end and negative-end signals of the differential signal is leading; as a result, the solution may stop using the leading signal instead of the falling-behind signal and thereby cannot prevent the transition of the leading signal from affecting the falling-behind signal. This affection may cause the increase of data error rate.

Figure 1:
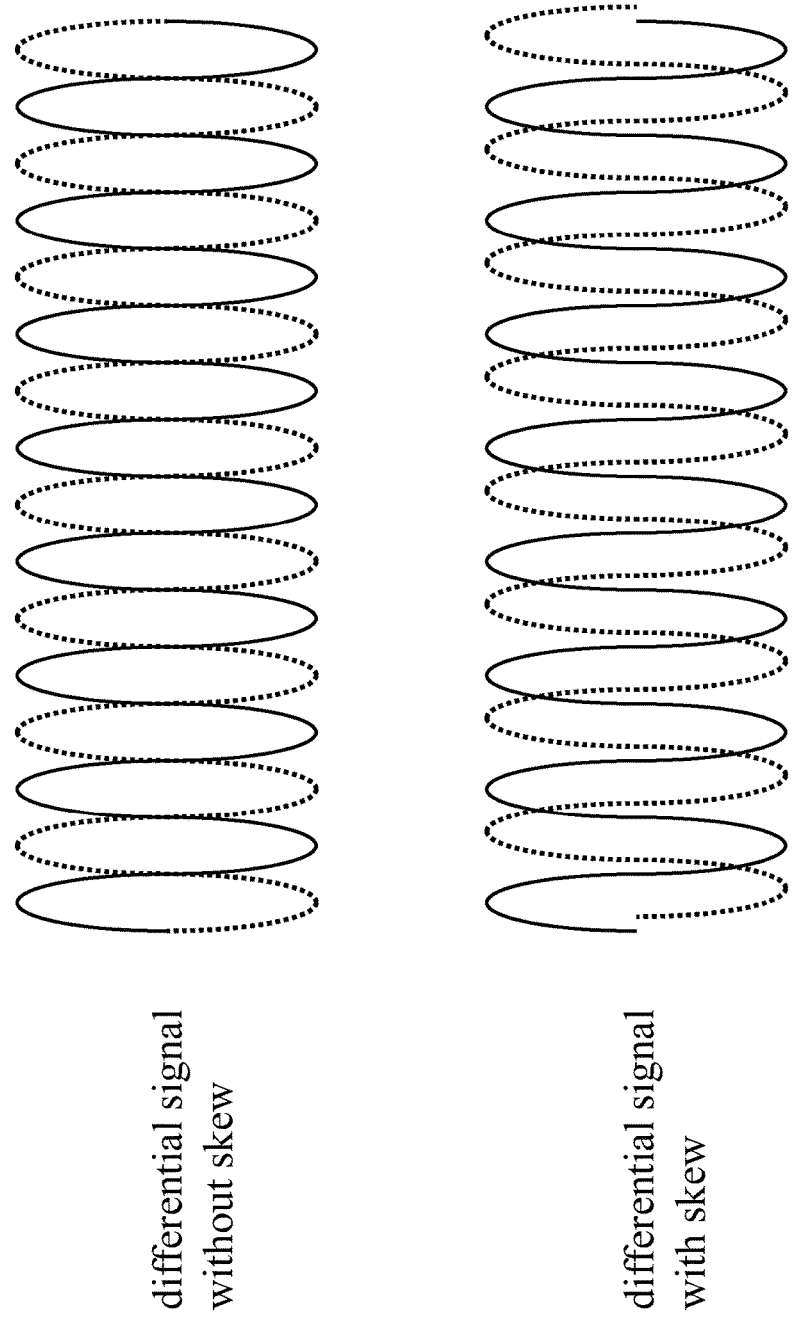
FIG. 1 illustrates a differential signal without skew and a differential signal with skew.
Figure 2:
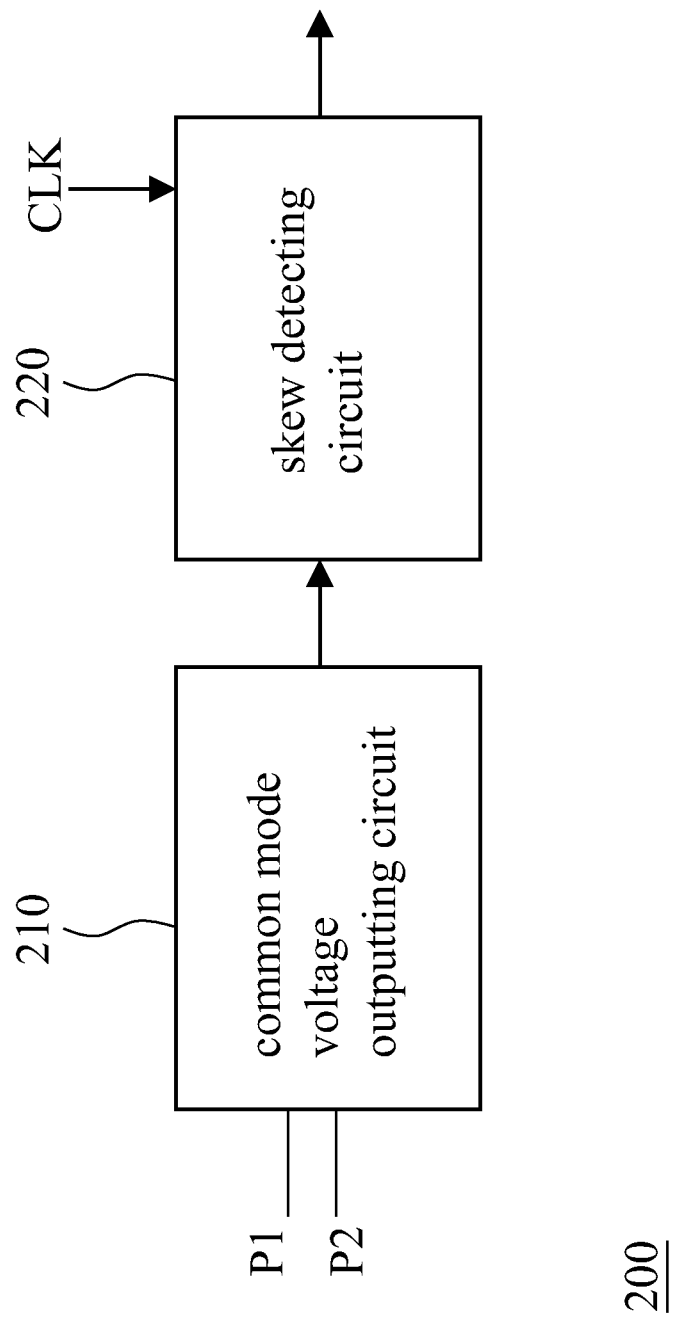
FIG. 2 illustrates an embodiment of the differential signal skew detecting circuit of the present invention.
Figure 3:
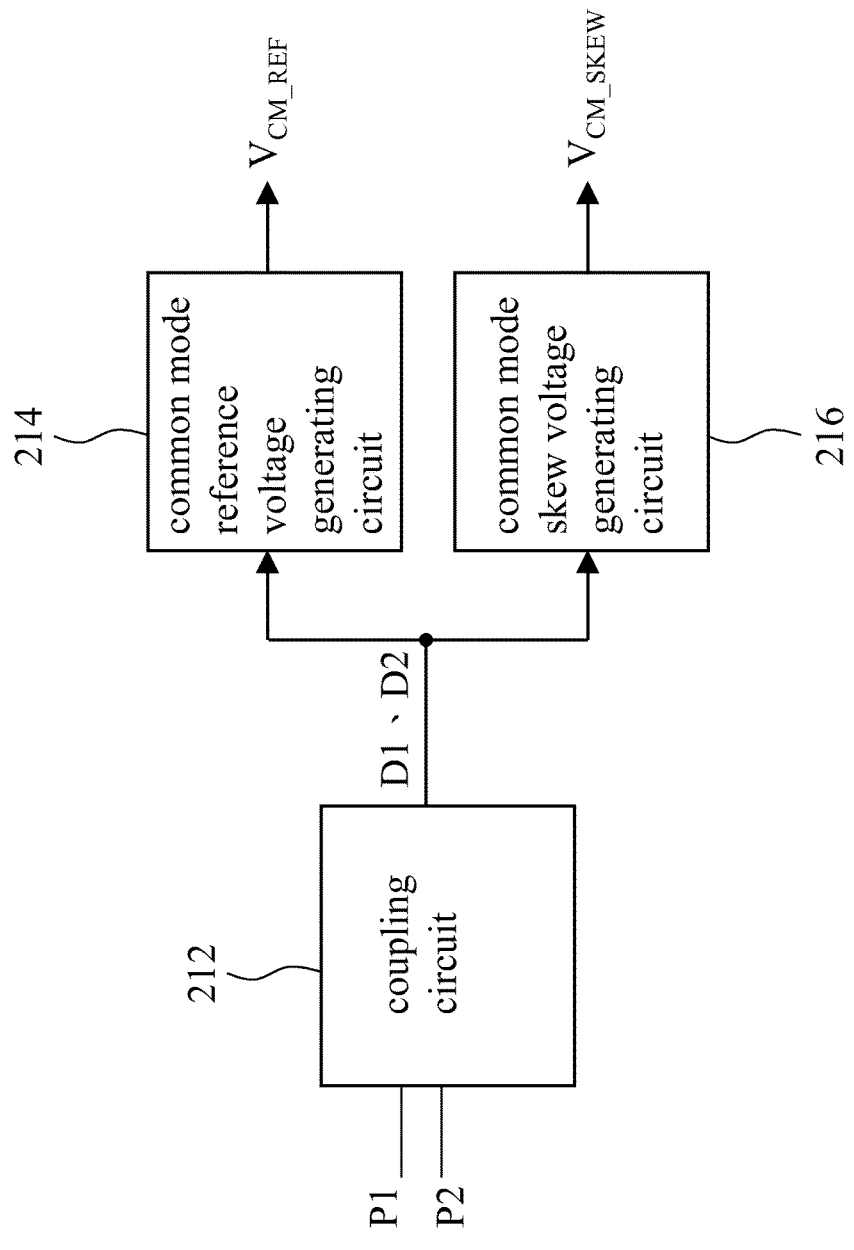
FIG. 3 illustrates an embodiment of the common mode voltage outputting circuit of FIG. 2.

In light of the above, the present invention discloses a differential signal skew detecting circuit and method as a better solution. FIG. 2 illustrates an embodiment of the differential signal skew detecting circuit. As shown in FIG. 2, the detecting circuit 200 includes a common mode voltage outputting circuit 210 and a skew detecting circuit 220. The common mode voltage outputting circuit 210 is configured to output a common mode reference voltage $V_{CM\_REF}$ and a common mode skew voltage $V_{CM\_SKEW}$ according to a differential signal. The differential signal is originated with two signals P1, P2 of a pair of transmission line, and includes a first-end signal D1 and a second-end signal D2 (as shown in FIG. 3). Ideally, the second-end signal D2 is the inverse signal of the first-end signal D1. The skew detecting circuit 220 is configured to inspect the common mode reference voltage $V_{CM\_REF}$ and the common mode skew voltage $V_{CM\_SKEW}$, and thereby output a skew detection value. When the skew detecting circuit 220 detects a skew of the differential signal, the skew detection value is a first value (e.g., a digital value "1" or a level higher than a predetermined threshold); when the skew detecting circuit 220 detects no skew of the differential signal, the skew detection value is a second value (e.g., a digital value "0" or a level lower than a predetermined threshold). In this embodiment, the skew detecting circuit 220 uses a comparing circuit to compare the common mode reference voltage $V_{CM\_REF}$ with the common mode skew voltage $V_{CM\_SKEW}$ according to a clock signal CLK, and thereby outputs the skew detection value being the first value (when $V_{CM\_SKEW} > V_{CM\_REF}$) or the second value (when $V_{CM\_SKEW} < V_{CM\_REF}$). The clock signal CLK here is used as a trigger signal to trigger the operation of the comparing circuit or to sample the output of the comparing circuit. It should be noted that the above-described skew detecting circuit 220 is just exemplary for understanding; in other words, other means capable of detecting the difference between the common mode reference voltage $V_{CM\_REF}$ and the common mode skew voltage $V_{CM\_SKEW}$ can be used to implement the skew detecting circuit 220. It should be also noted that if there is no skew of the differential signal, the swing of $V_{CM\_SKEW}$ would be zero ideally; in other words, the greater the magnitude of the swing of $V_{CM\_SKEW}$, the higher the skew of the differential signal; therefore, the skew can be detected by inspecting the common mode reference voltage $V_{CM\_REF}$ and the common mode skew voltage $V_{CM\_SKEW}$.

Figure 4:
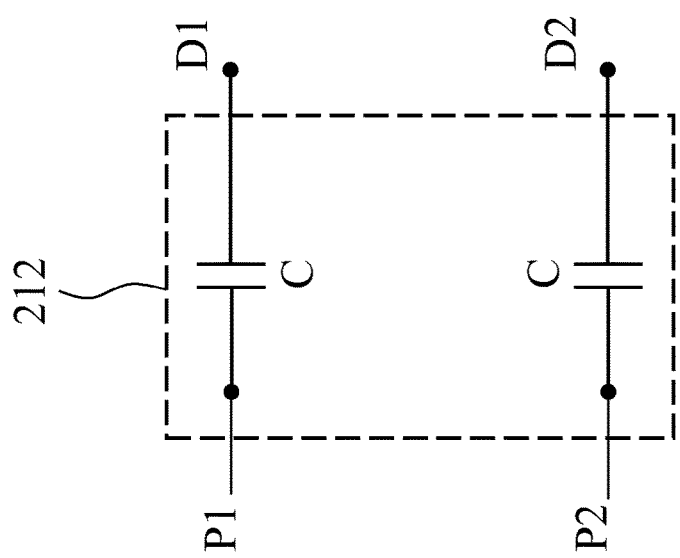
FIG. 4 illustrates an embodiment of the coupling circuit of FIG. 3.
Figure 5:
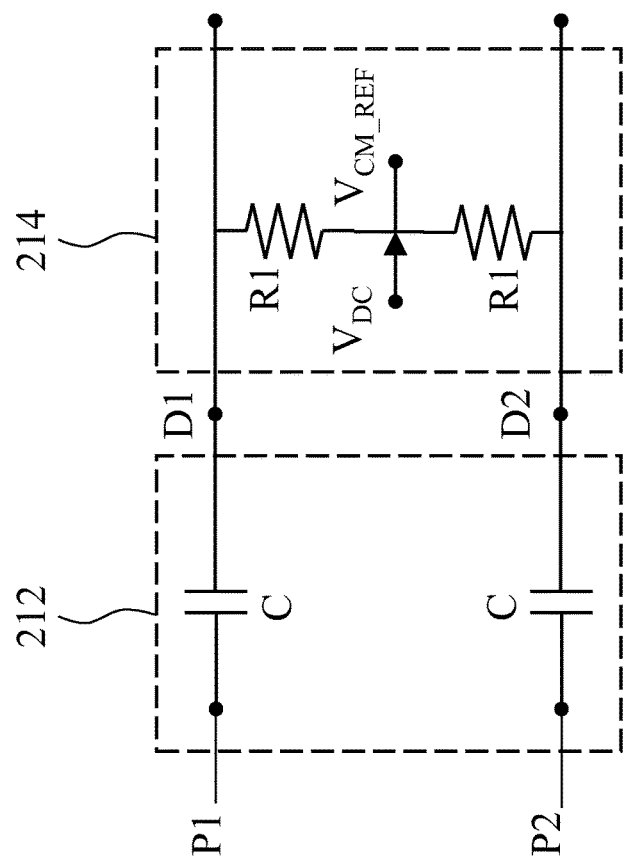
FIG. 5 illustrates an exemplary implementation of the common mode reference voltage generating circuit of FIG. 3.
Figure 6:
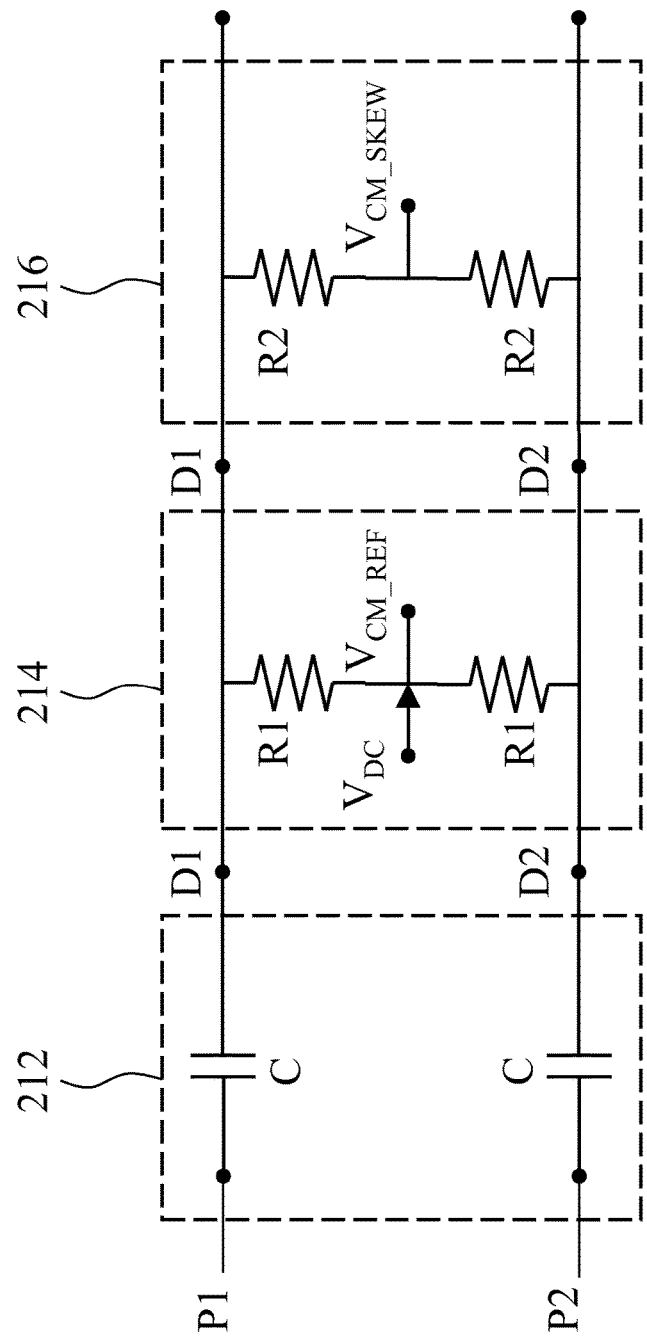
FIG. 6 illustrates an exemplary implementation of the common mode skew voltage generating circuit of FIG. 3.

FIG. 3 illustrates an embodiment of the common mode voltage outputting circuit 210. As shown in FIG. 3, the outputting circuit 210 includes: a coupling circuit 212 configured to generate the differential signal including signals D1, D2 according to a differential transmission signal including signals P1, P2; a common mode reference voltage generating circuit 214 configured to generate the common mode reference voltage $V_{CM\_REF}$ according to a direct-current (DC) voltage and a first average value of the signals D1, D2; and a common mode skew voltage generating circuit 216 configured to generate the common mode skew voltage $V_{CM\_SKEW}$ according to a second average value of the signals D1, D2. An exemplary implementation of the coupling circuit 212 is shown in FIG. 4, which is an alternating-current (AC) capacitor circuit 212 configured to generate the signals D1, D2 according to a capacitance value C and the signals P1, P2. An exemplary implementation of the common mode reference voltage generating circuit 214 is shown in FIG. 5, which generates the first average value of the signals D1, D2 according to a first resistance value R1 and then generates the common mode reference voltage $V_{CM\_REF}$ by carrying the first average value with a DC voltage (i.e., DC offset) $V_{DC}$ which can be generated in a well-known manner. An exemplary implementation of the common mode skew voltage generating circuit 216 is shown in FIG. 6, which generates the second average value of the signals D1, D2 according to a second resistance value R2 and treats the second average value as the common mode skew voltage $V_{CM\_SKEW}$. In the above-described implementations, the first resistance value R1 is greater than the second resistance value R2; in another implementation of the present disclosure, the first resistance value R1 may be at least ten times the second resistance value R2.

Figure 7:
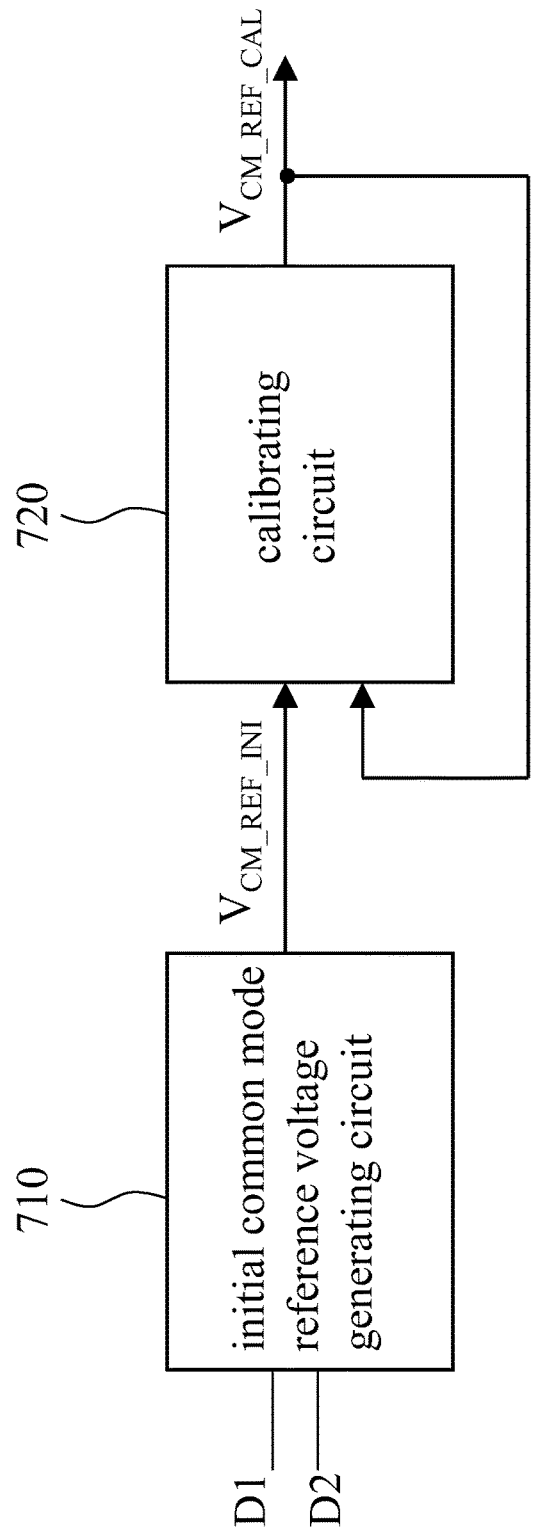
FIG. 7 illustrates another exemplary implementation of the common mode reference voltage generating circuit of FIG. 3.

The skew detecting circuit 220 uses a comparing circuit to compare the common mode reference voltage $V_{CM\_REF}$ with the common mode skew voltage $V_{CM\_SKEW}$ according to the clock signal CLK. In order to reduce the influence of the offset caused by the comparing circuit on the skew detection value when performing such comparison, the common mode reference voltage generating circuit 214 may, in some embodiments, reduce the influence of the offset through a calibration process. For instance, as shown in FIG. 7, the common mode reference voltage generating circuit 214 includes an initial common mode reference voltage generating circuit 710 and a calibrating circuit 720. The initial common mode reference voltage generating circuit 710 is configured to use the aforementioned first resistance value R1 and the DC voltage $V_{DC}$ to generate an initial common mode reference voltage $V_{CM\_REF\_CAL}$ according to the signals D1, D2. The calibrating circuit 720 is configured to generate an adjusted common mode reference voltage $V_{CM\_REF\_CAL}$ according to the initial common mode reference voltage $V_{CM\_REF\_INI}$, then generate a comparison result by comparing the initial common mode reference voltage $V_{CM\_REF\_INI}$ with the adjusted common mode reference voltage $V_{CM\_REF\_CAL}$ with a comparing circuit (i.e., the comparing circuit for comparing the common mode reference voltage $V_{CM\_REF}$ with the common mode skew voltage $V_{CM\_SKEW}$), and then generate the common mode reference voltage $V_{CM\_REF}$ according to the comparison result.

Figure 8:
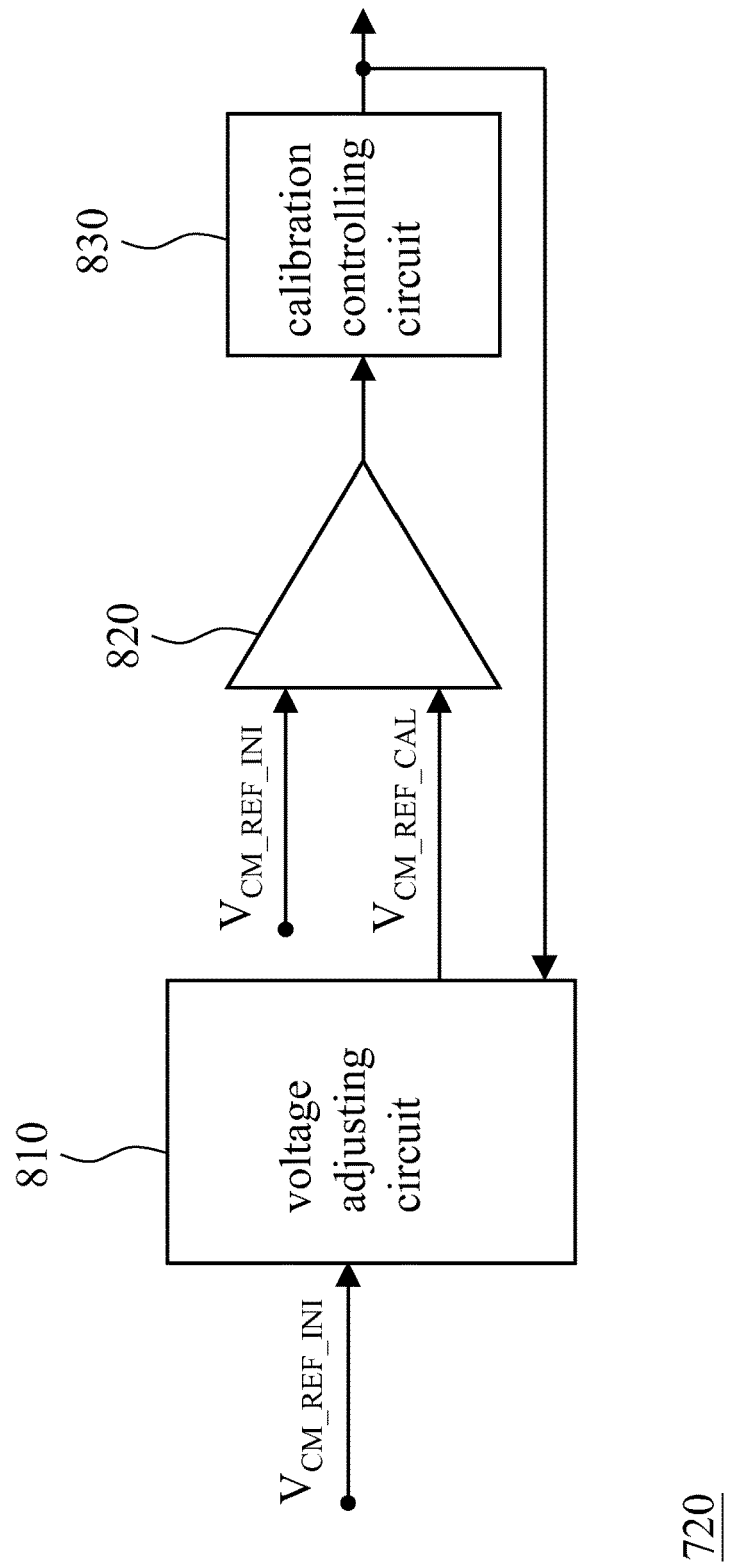
FIG. 8 illustrates an exemplary implementation of the calibrating circuit of FIG. 7.

On the basis of the above, an exemplary implementation of the initial common mode reference voltage generating circuit 710 is the circuit 214 of FIG. 5 or the equivalent thereof; and an exemplary implementation of the calibrating circuit 720 is shown in FIG. 8, including a voltage adjusting circuit 810, a comparing circuit 820 (i.e., the comparing circuit for comparing the common mode reference voltage $V_{CM\_REF}$ with the common mode skew voltage $V_{CM\_SKEW}$, and a calibration controlling circuit 830. The voltage adjusting circuit 810 is a digital-to-analog converter or the equivalent thereof (e.g., a combination of at least a current source and an adjustable resistor network), configured to output the adjusted common mode reference voltage $V_{CM\_REF\_CAL}$ according to the initial common mode reference voltage $V_{CM\_REF\_INI}$ (while at first the two voltages $V_{CM\_REF\_INI}$, $V_{CM\_REF\_CAL}$ could be the same, or different by a predetermined voltage value, or different by K adjustment value(s), in which K is an integer and the adjustment value(s) will be described in a later paragraph). The comparing circuit 820 compares the initial common mode reference voltage $V_{CM\_REF\_INI}$ with the adjusted common mode reference voltage $V_{CM\_REF\_CAL}$ to generate the comparison result. The calibration controlling circuit 830 determines whether the comparison result indicates that the initial common mode reference voltage $V_{CM\_REF\_INI}$ and the adjusted common mode reference voltage $V_{CM\_REF\_CAL}$ are equivalent or close to the same value; when comparison result indicates that the two voltages $V_{CM\_REF\_INI}$, $V_{CM\_REF\_CAL}$ are equivalent or similar, the calibration controlling circuit 830 stops doing the calibration and treats the adjusted common mode reference voltage $V_{CM\_REF\_CAL}$ as the common mode reference voltage $V_{CM\_REF}$; and when the comparison result indicates that the two voltages $V_{CM\_REF\_INI}$, $V_{CM\_REF\_CAL}$ are substantially different, the calibration controlling circuit 830 has the voltage adjusting circuit 810 gradually adjust the adjusted common mode reference voltage $V_{CM\_REF\_CAL}$ by an adjustment value until the comparison result indicates that the two voltages $V_{CM\_REF\_INI}$, $V_{CM\_REF\_CAL}$ are equivalent or similar. In this exemplary implementation, the calibration controlling circuit 830 finds out whether the two voltages $V_{CM\_REF\_INI}$, $V_{CM\_REF\_CAL}$ are equivalent or close to the same value by determining whether the comparison result switches alternatively between a first comparison result (e.g., $V_{CM\_REF\_CAL} > V_{CM\_REF\_INI}$) and a second comparison result (e.g., $V_{CM\_REF\_INI} > V_{CM\_REF\_CAL}$) for a predetermined time(s) (e.g., M times, in which M is an integer greater than one). To be more specific, when the comparison result switches alternatively for the predetermined time(s), the two voltages $V_{CM\_REF\_INI}$, $V_{CM\_REF\_CAL}$ are determined to be equivalent or close to the same value. Of course other means capable of determining whether two voltages are the same or similar can be introduced to the calibration controlling circuit 830.

In order to prevent the skew detecting circuit 220 from being too sensitive, in a non-restrictive embodiment, after stopping the calibration, the calibrating circuit 720 may add the adjusted common mode reference voltage $V_{CM\_REF\_CAL}$ and a threshold voltage $V_{TH}$ up to be the common mode reference voltage $V_{CM\_REF}$ (i.e., $V_{CM\_REF} = V_{CM\_REF\_CAL} + V_{TH}$). For instance, after stopping the calibration, the calibrating circuit 720 may add the adjusted common mode reference voltage $V_{CM\_REF\_CAL}$ and N adjustment value(s) (equivalent to the threshold voltage $V_{TH}$) through the voltage adjusting circuit 810 of FIG. 8, so as to generate the common mode reference voltage $V_{CM\_REF}$. The N is a positive integer.

Figure 9:
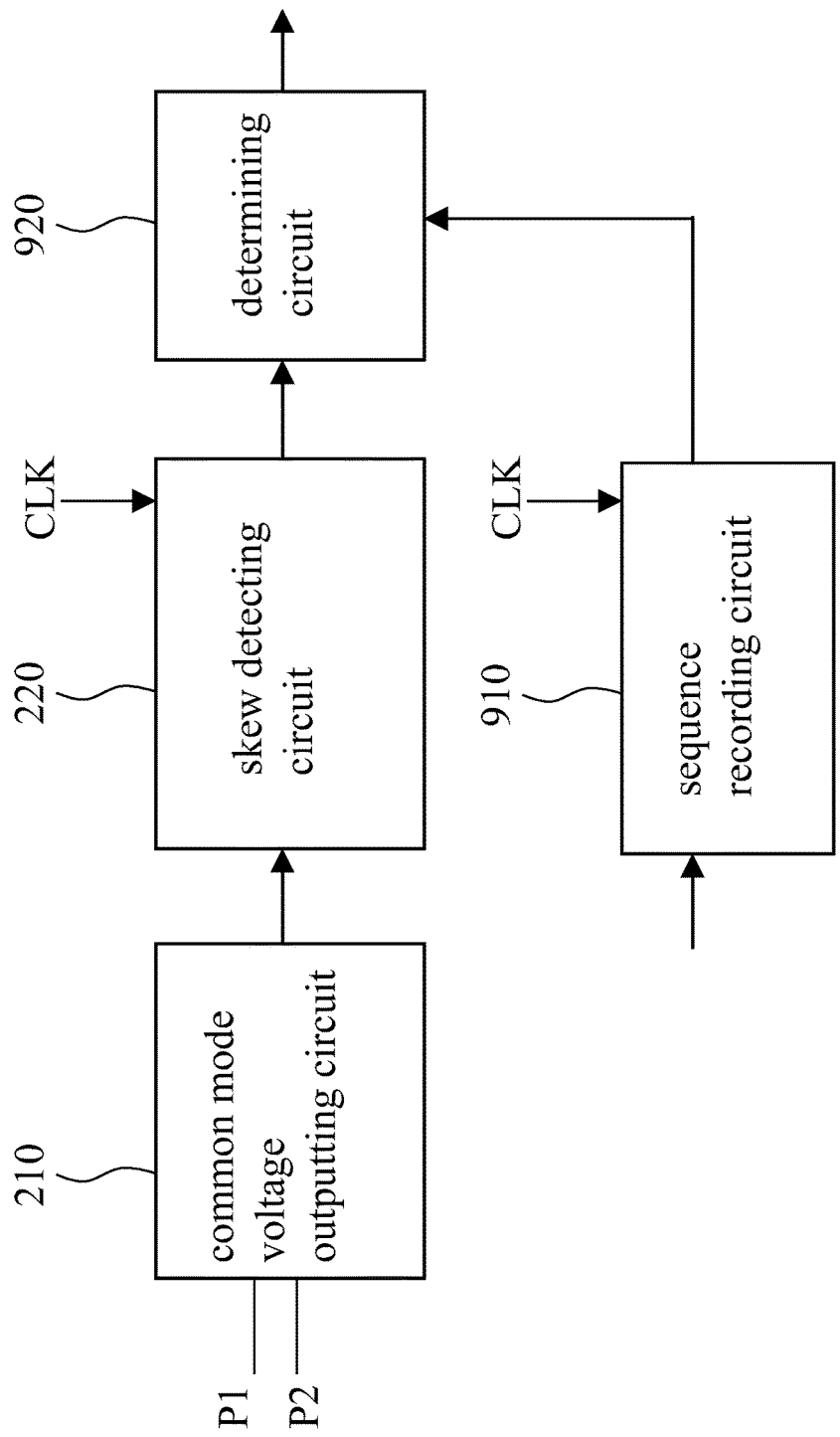
FIG. 9 illustrates another embodiment of the differential signal skew detecting circuit of the present invention.

In addition to detecting a skew of a differential signal, the present invention can further determine which of the positive-end and negative-end signals of the differential signal being leading. FIG. 9 illustrates another embodiment of the differential signal skew detecting circuit of the present invention. Compared with FIG. 2, the differential signal skew detecting circuit 900 further includes a sequence recording circuit 910 and a determining circuit 920. The sequence recording circuit 910 may include a plurality of flip-flops connected in series or the equivalent thereof, and is configured to record a sequence. The sequence correlates with the differential signal and includes a plurality of sequence values. The determining circuit 920 could be a logic circuit, a state machine, or any circuit capable of executing a determination process according to one or more values, and is configured to determine which of a first-end signal and a second-end signal of the differential signal being leading according to the sequence and the skew detection value. For instance, when the sequence (e.g., 0 0 1) includes a transition from a first sequence value (e.g., 0) to a second sequence value (e.g., 1) and the skew detection value is the first value (e.g., 1), the determining circuit 920 determines that the first-end signal (e.g., a positive-end signal of the differential signal) is leading; when the sequence (e.g., 1 1 0) includes a transition from the second sequence value (e.g., 1) to the first sequence value (e.g., 0) and the skew detection value is the first value (e.g., 1), the determining circuit 920 determines that the second-end signal (e.g., a negative-end signal of the differential signal) is leading. To be more specific, ideally the transition from 0 to 1 indicates that the positive-end signal of the differential signal rises up and reaches the maximum and the negative-end signal of the differential signal falls down and reaches the minimum when the differential signal is sampled; however, if the skew of the differential signal exists as indicated by the skew detection value, when the positive-end signal reaches the maximum, the negative-end signal falls down but does not reach the minimum yet, which implies that the positive-end signal in comparison with the negative-end signal is leading.

Please refer to FIG. 9 again. In this embodiment, the sequence is obtained by sampling the differential signal according to the aforementioned clock signal CLK, so that the sequence recording circuit 910 and the skew detecting circuit 220 can synchronize in accordance with the clock signal CLK, and therefore the determining circuit 920 can generate a more accurate determination result according to the transition of the sequence and the current value of the skew detection value. It should be noted that the determining result 920 and the skew detecting circuit 220 may operate according to different trigger signals respectively as long as the consequent effect is acceptable. It should be also noted that the sampling process can be carried out by a known or self-developed clock and data recovery (CDR) circuit, a data recovery circuit, or any circuit capable of sampling the differential signal according to the clock signal CLK. Since those of ordinary skill in the art can appreciate how to realize a sampling process with a known art, the detail is omitted.

Figure 10:
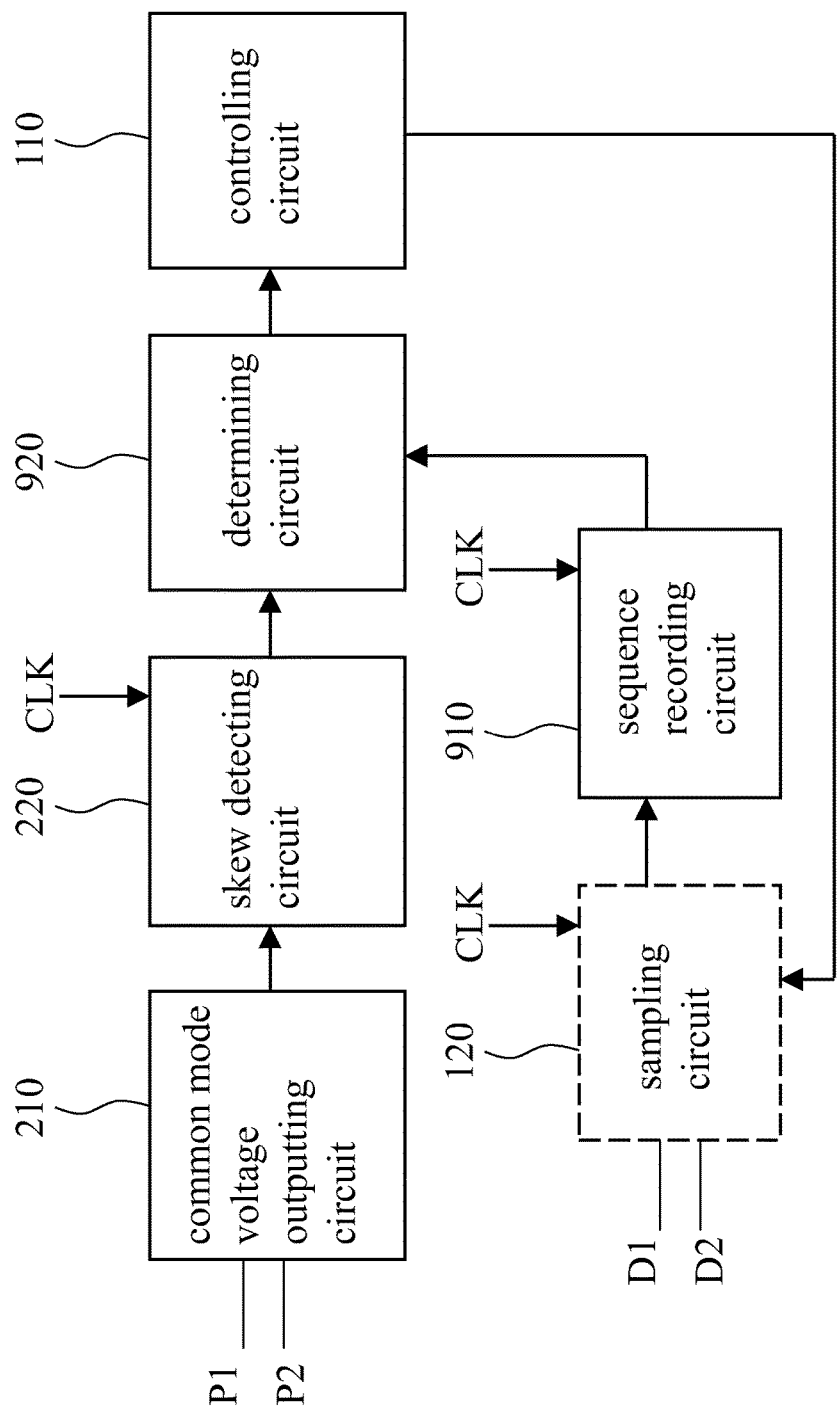
FIG. 10 illustrates a further embodiment of the differential signal skew detecting circuit of the present invention.

After determining which of the first-end and second-end signals of the differential signal being leading, the present invention can reduce the skew influence of the differential signal accordingly. FIG. 10 illustrates another embodiment of the differential signal skew detecting circuit of the present invention. Compared with FIG. 9, the differential signal skew detecting circuit 100 further includes a controlling circuit 110. The controlling circuit 110 is configured to have a sampling circuit 120 or the front-end circuit thereof (not shown in the figures) stop using the second-end signal when the determining circuit 920 determines that the first-end signal is leading, and configured to have the sampling circuit 120 or the front-end circuit thereof stop using the first-end signal when the determining circuit 920 determines that the second-end signal is leading, so as to prevent the skew influence of the differential signal. The sampling circuit 120 (drawn in dash-line) or the front-end circuit thereof is or is not included in the detecting circuit 100, and operates according to the clock signal CLK in this embodiment; however, these are options instead of limitations.

Figure 11:
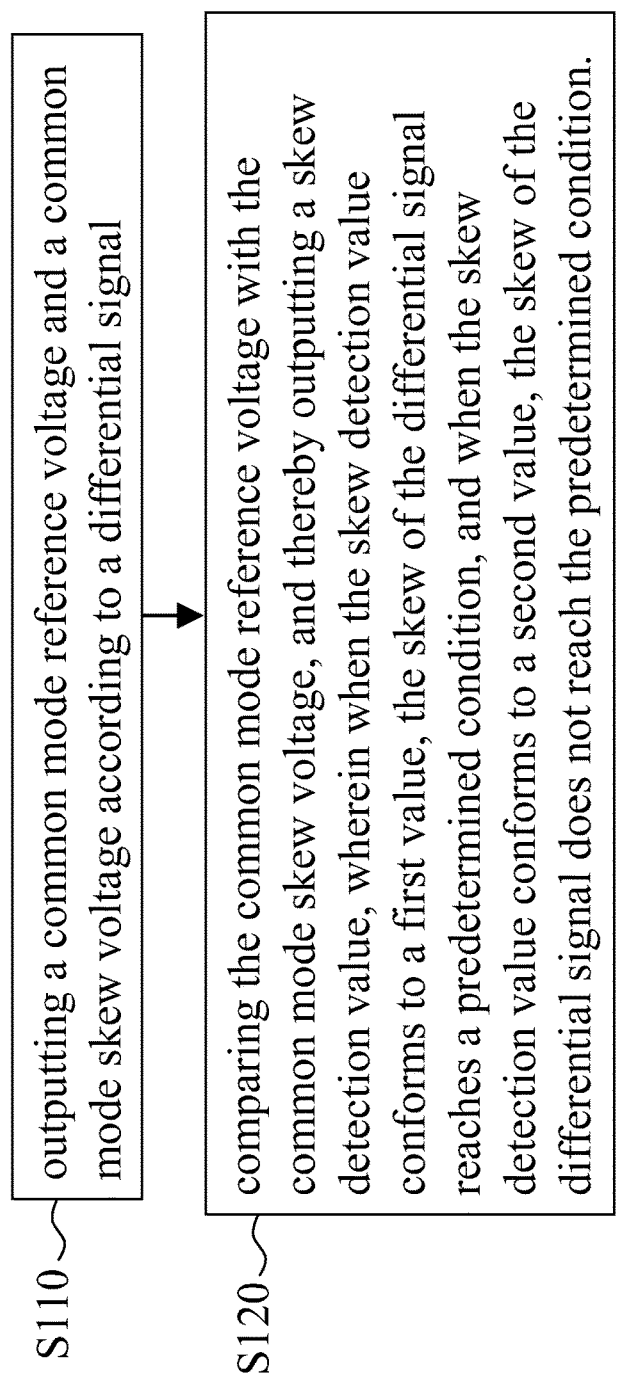
FIG. 11 illustrates an embodiment of the differential signal skew detecting method of the present invention.

In addition to the differential signal skew detecting circuit, the present invention further discloses a differential signal skew detecting method capable of detecting a skew of a differential signal. FIG. 11 shows an embodiment of the method including the following steps:

Step S110: outputting a common mode reference voltage and a common mode skew voltage according to a differential signal. This step can be carried out by the common mode voltage outputting circuit 210 of FIG. 2 or the equivalent thereof.

Step S120: comparing the common mode reference voltage with the common mode skew voltage, and thereby outputting a skew detection value, wherein when the skew detection value conforms to a first value (i.e., the relation between skew detection value and the first value satisfying a first predetermined relation), the skew of the differential signal reaches a predetermined condition (e.g., a skew-detected condition), and when the skew detection value conforms to a second value (i.e., the relation between skew detection value and the second value satisfying a second predetermined relation), the skew of the differential signal does not reach the predetermined condition. This step can be carried out by the skew detecting circuit 220 of FIG. 2 or the equivalent thereof.

Since people of ordinary skill in the art can appreciate the detail and modification of the method embodiment by referring to the fore-disclosed circuit embodiments, which implies that the features of the circuit embodiments can be applied to the method embodiment in a reasonable way, repeated and redundant description is omitted.

To sum up, the differential signal skew detecting circuit and method of the present invention can effectively detect the intra-pair skew of a differential pair, and can determine which of the positive-end and negative-end signals of a differential signal being leading, so that the problem of the prior arts incapable of efficaciously dealing with the intra-pair skew is solved.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A differential signal skew detecting circuit configured to detect a skew of a differential signal, comprising:
   a common mode voltage outputting circuit configured to output a common mode reference voltage and a common mode skew voltage, the common mode voltage outputting circuit including:
      an alternating-current (AC) coupling capacitor circuit configured to generate the differential signal according to a capacitance value and a differential transmission signal;
      a common mode reference voltage generating circuit configured to generate the common mode reference voltage according to a first resistance value and a direct-current (DC) voltage; and
      a common mode skew voltage generating circuit configured to generate the common mode skew voltage according to a second resistance value; and
   a skew detecting circuit configured to inspect the common mode reference voltage and the common mode skew voltage according to a clock signal, and output a skew detection value,
   wherein when the skew detecting circuit detects the skew of the differential signal, the skew detection value is outputted as a first value; and when the skew detecting circuit does not detect the skew of the differential signal, the skew detection value is outputted as a second value different from the first value.

2. The differential signal skew detecting circuit of claim 1, wherein the first resistance value is greater than the second resistance value.

3. The differential signal skew detecting circuit of claim 1, wherein the common mode reference voltage generating circuit includes:
   an initial common mode reference voltage generating circuit configured to generate an initial common mode reference voltage according to the first resistance value and the DC current; and
   a calibrating circuit configured to generate an adjusted common mode reference voltage, generate a comparison result by comparing the initial common mode reference voltage with the adjusted common mode reference voltage with a comparing circuit, and generate the common mode reference voltage according to the comparison result.

4. The differential signal skew detecting circuit of claim 3, wherein the calibrating circuit adjusts the adjusted common mode reference voltage according to an adjustment value until the comparison result switches alternatively between a first comparison result and a second comparison result for a predetermined time, and then the calibrating circuit adds the adjusted common mode reference voltage and a threshold voltage to thereby generate the common mode reference voltage.

5. The differential signal skew detecting circuit of claim 3, wherein the skew detecting circuit outputs the skew detection value by the comparing circuit comparing the common mode reference voltage with the common mode skew voltage according to the clock signal.

6. A differential signal skew detecting circuit configured to detect a skew of a differential signal, comprising:
   a common mode voltage outputting circuit configured to output a common mode reference voltage and a common mode skew voltage;
   a skew detecting circuit configured to inspect the common mode reference voltage and the common mode skew voltage according to a clock signal, and output a skew detection value;
   a sequence recording circuit configured to record a sequence which correlates with the differential signal and includes a plurality of sequence values; and
   a determining circuit configured to determine which of a first-end signal and a second-end signal of the differential signal is leading according to the sequence and the skew detection value,
   wherein when the skew detecting circuit detects the skew of the differential signal, the skew detection value is outputted as a first value; and when the skew detecting circuit does not detect the skew of the differential signal, the skew detection value is outputted as a second value different from the first value.

7. The differential signal skew detecting circuit of claim 6, wherein when the sequence includes a transition from a first sequence value to a second sequence value and the skew detection value is the first value, the determining circuit determines the first-end signal is leading; when the sequence includes a transition from the second sequence value to the first sequence value and the skew detection value is the first value, the determining circuit determines the second-end signal is leading.

8. The differential signal skew detecting circuit of claim 6, further comprising:
a control circuit configured to stop using the second-end signal to prevent influence of the skew of the differential signal when the determining circuit determines the first-end signal is leading, and stop using the first-end signal to prevent influence of the skew of the differential signal when the determining circuit determines the second-end signal is leading.

9. The differential signal skew detecting circuit of claim 6, wherein the sequence is obtained by sampling the differential signal according to the clock signal.

10. A differential signal skew detecting method for detecting a skew of a differential signal, comprising:
outputting a common mode reference voltage and a common mode skew voltage; and
comparing the common mode reference voltage with the common mode skew voltage according to a clock signal and thereby outputting a skew detection value,
wherein if the skew of the differential signal reaches a predetermined condition, the skew detection value is a first value; and if the skew of the differential signal does not reach the predetermined condition, the skew detection value is a second value different with the first value.

11. The differential signal skew detecting method of claim 10, wherein the step of outputting the common mode reference voltage and the common mode skew voltage includes:
generating the differential signal according to a differential transmission signal;
generating the common mode reference voltage according to a direct-current (DC) voltage and a first average value of the differential signal; and
generating the common mode skew voltage according to a second average value of the differential signal.

12. The differential signal skew detecting method of claim 11, wherein the step of generating the common mode reference voltage includes:
generating the first average value according to a first resistance value and the differential signal; and generating the second average value according to a second resistance value and the differential signal.

13. The differential signal skew detecting method of claim 11, wherein the step of generating the common mode reference voltage includes:
generating an initial common mode reference voltage according to the DC voltage and the first average value; and
generating an adjusted common mode reference voltage according to the initial common mode reference voltage, comparing the initial common mode reference voltage with the adjusted common mode reference voltage to generate a comparison result, and generating the common mode reference voltage according to the comparison result.

14. The differential signal skew detecting method of claim 13, wherein the step of generating the common mode reference voltage further includes:
adjusting the adjusted common mode reference voltage according to an adjustment value until the comparison result switches alternatively between a first comparison result and a second comparison result for a predetermined time; and
adding the adjusted common mode reference voltage and a threshold voltage up to be to thereby generate the common mode reference voltage.

15. The differential signal skew detecting method of claim 10, further comprising:
recording a sequence which is obtained by sampling the differential signal according to the clock signal and includes a plurality of sequence values; and
determining which of a first-end signal and a second-end signal of the differential signal is leading according to the sequence and the skew detection value.

16. The differential signal skew detecting method of claim 15, wherein the step of determining which of the first-end signal and the second-end signal is leading includes:
when the sequence includes a transition from a first sequence value to a second sequence value and the skew detection value is the first value, determining the first-end signal is leading; when the sequence includes a transition from the second sequence value to the first sequence value and the skew detection value is the first value, determining the second-end signal is leading.

17. The differential signal skew detecting method of claim 15, further comprising:
stopping using the second-end signal to prevent influence of the skew of the differential signal when determining the first-end signal is leading, and stopping using the first-end signal to prevent influence of the skew of the differential signal when determining the second-end signal is leading.

18. The differential signal skew detecting method of claim 10, wherein the differential signal is composed of two signals of a pair of transmission line.

\* \* \* \* \*